United States Patent
Lee et al.

(10) Patent No.: US 6,806,776 B2
(45) Date of Patent: Oct. 19, 2004

(54) TRANSCONDUCTOR TUNING CIRCUIT (75) Inventors: Jeong-won Lee, Sungnam (KR); Gea-ok Cho, Yongin (KR); Jung-eun Lee, Seoul (KR)

(73) Assignee: Samsung Electronics Co., Ltd., Gyunggi-Do (KR)

( * ) Notice: Subject to any disclaimer, the term of this patent is extended or adjusted under 35 U.S.C. 154(b) by 12 days.

(21) Appl. No.: 10/373,837

(22) Filed: Feb. 27, 2003

(65) Prior Publication Data

US 2003/0169115 A1 Sep. 11, 2003

(30) Foreign Application Priority Data

Mar. 7, 2002 (KR) ......................................... 2002-12223

(51) Int. Cl.[7] .............................. H03F 3/04; H03F 3/45
(52) U.S. Cl. ....................................... 330/305; 330/260
(58) Field of Search ................................... 330/305, 260

(56) References Cited

U.S. PATENT DOCUMENTS

| | | | | |
|---|---|---|---|---|
| 3,904,976 A | * | 9/1975 | Ahmed | ........................ 330/257 |
| 5,585,763 A | * | 12/1996 | Navabi et al. | ............... 330/255 |
| 6,064,267 A | * | 5/2000 | Lewyn | ........................ 330/288 |
| 6,489,849 B1 | * | 12/2002 | Gilbert | ........................ 330/284 |
| 6,498,466 B1 | * | 12/2002 | Edwards | ..................... 323/282 |

* cited by examiner

Primary Examiner—Patricia Nguyen
(74) Attorney, Agent, or Firm—Sughrue Mion, PLLC

(57) ABSTRACT

A transconductor tuning circuit for controlling transconductance of a transconductor. The tuning circuit includes a first MOS (Metal-Oxide Semiconductor) transistor. A source terminal of the first MOS transistor is connected to a power source. A gate terminal and a drain terminal of the first MOS transistor being connected to each other. A gate terminal and a drain terminal of a second MOS transistor being connected. A first input terminal of a first error amplifier is connected to the gate terminal of the first MOS transistor. A second input terminal of the first error amplifier is connected to the gate terminal of the second MOS transistor. The first error amplifier outputs an output signal in form of a bias signal for controlling tuning of the transconductor.

8 Claims, 6 Drawing Sheets

TRANSCONDUCTOR TUNING CIRCUIT

BACKGROUND

This Application claims priority from Korean Patent Application No. 2002-12223, the contents of which are incorporated herein by reference.

1. Field of the Invention

This disclosure teaches techniques related to transconductor tuning circuits. Specifically, techniques related to transconductor tuning circuits capable of controlling transconductance value in high speed while reducing effects from external environment are taught.

2. Background of the Related Art

Transconductors are generally used as basic elements of an IC(Integrated Circuit). However, transconductance values of such transconductors change because of the influence of manufacturing processes, surrounding temperature, and voltage of power supply, etc. Therefore, a tuning circuit is required for controlling the circuit to maintain a constant transconductance. This is specifically critical for circuits that require precise transconductance.

A conventional transconductor tuning circuit using a BiCMOS element is disclosed in "A 20-MHz sixth-order BiCMOS parasitic insensitive continuous-time filter and second-order equalizer optimized for disc-drive read channels", IEEE J, Solid-State Circuits, Vol. 28, pp. 462–470, April, 1993. The BiCMOS transconductor tuning circuit disclosed in the above paper, is illustrated in FIG. 1.

Figure 1:
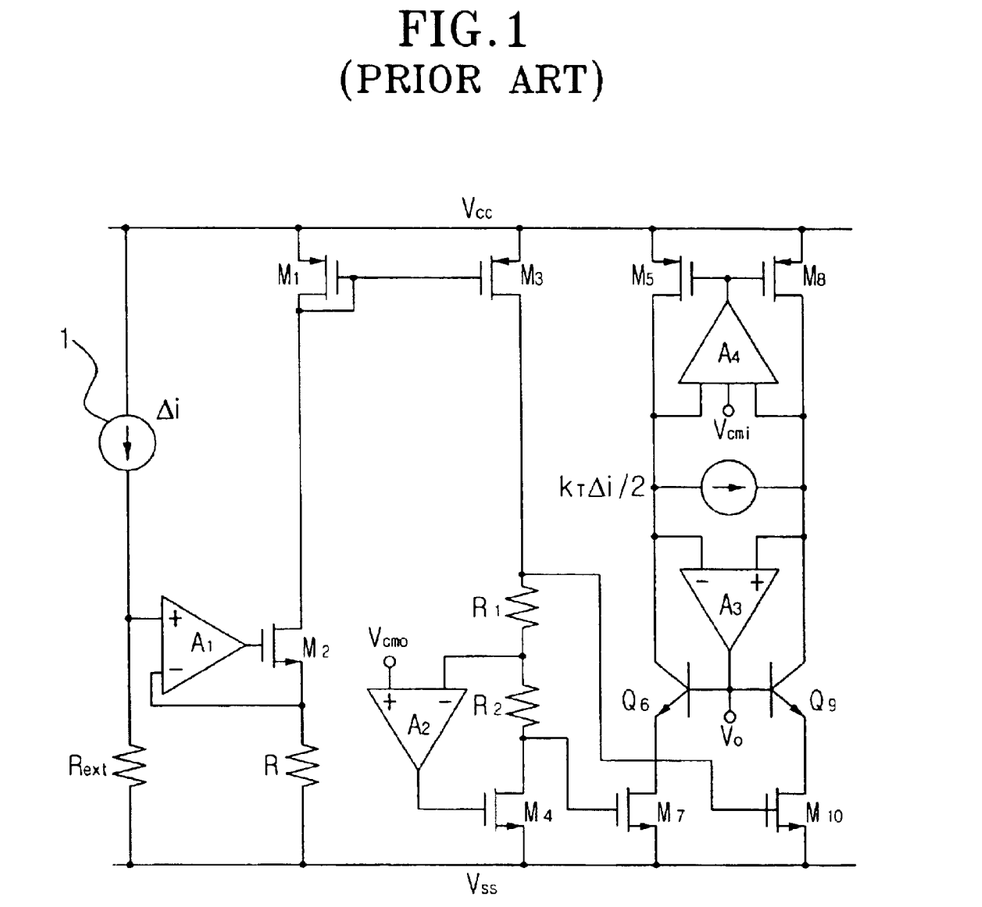
FIG. 1 is a circuit diagram representing a conventional tuning circuit for a transconductor.

Referring to FIG. 1, a sub-circuit including reference numerals Q6,Q9,M7,M10 is a basic circuit for a transconductor. Transconductance value of such a transconductor is controlled by an output voltage Vo of an error amplifier A3. The transconductor basic circuit is biased by MOS(Metal-Oxide Semiconductor) transistors M5 and M8 under control of a common-mode feedback(CMFB) amplifier. The transconductance control voltage Vo corresponding to a current difference $k_T\Delta i/2$ is output through an error amplifier A3.

The differential input voltage is a voltage difference between voltages respectively applied to MOS transistors M7 and M10. Assuming that the differential input voltage is $\Delta V$ and that a current control ratio is $k_T$, then a control value for an external transconductance(Gm) by an output voltage of the tuning circuit could be defined by the following formula.

$$Gm = \frac{k_T \Delta i/2}{\Delta v/2} = \frac{k_T}{R_{ext}} \quad \text{[Formula 1]}$$

In the circuit of FIG. 1, a variable range of the current $\Delta I$ flowing through a current source 1 is restricted within a narrow range by restricting the input voltage range(common mode range: CMR) of the error amplifier A1. Also, a CMFB circuit is used for compensating for an input voltage range of the error amplifier A3. Clearly, such a circuit is complex making it difficult to construct.

In order for a tuning circuit to stably control a voltage of a transconductor in high speed, the frequency range of operation of the tuning circuit should be maintained accordingly. A voltage difference, corresponding to a current difference $k_T\Delta i/2$, passes through the multi-stage amplifier. Such a multi-stage amplifier consists of the error amplifier A3, transistors Q6 and M5, or another transistors Q9 and M8. Therefore, it is difficult to extend and compensate for a frequency range for stable operation of this closed loop.

The disclosed techniques are aimed at overcoming some of the disadvantages noted above. Specifically this disclosure is aimed at providing a transconductor tuning circuit capable of extending an operation frequency range while reducing effects from external environment.

SUMMARY

To overcome some of the disadvantages discussed above, there is provided a transconductor tuning circuit for controlling transconductance of a transconductor. The tuning circuit comprises a first MOS (Metal-Oxide Semiconductor) transistor. A source terminal of the first MOS transistor is connected to a power source. A gate terminal and a drain terminal of the first MOS transistor being connected to each other. A gate terminal and a drain terminal of a second MOS transistor being connected a first input terminal of a first error amplifier is connected to the gate terminal of the first MOS transistor. A second input terminal of the first error amplifier is connected to the gate terminal of the second MOS transistor. The first error amplifier outputs an output signal in form of a bias signal for controlling tuning of the transconductor.

In another specific enhancement, the transconductor comprises a first bipolar transistor connected for receiving the bias signal through a base of the first bipolar transistor, a collector terminal of the first bipolar transistor being connected to drain terminal of the first MOS transistor. A second bipolar transistor is connected for receiving the bias signal through a base of the second bipolar transistor, a collector terminal of the second bipolar transistor being connected to drain terminal of the second MOS transistor. A third MOS transistor is connected for receiving differential input signal generated from a differential input signal generating unit, a drain terminal of the third MOS transistor being connected to an emitter terminal of the first bioplar transistor. A fourth MOS transistor is connected for receiving differential input signal generated from the differential input signal generating unit, a drain terminal of the fourth MOS transistor being connected to an emitter terminal of the second bioplar transistor.

More specifically the differential input signal generating unit comprises a second error amplifier, a reference voltage being provided to a first input terminal of the second error amplifier, a first and a second voltage distribution resistance connected in series with a second input terminal of the second error amplifier. A fifth MOS transistor is provided, a source terminal of the fifth MOS transistor being connected to the power supply, a gate terminal of the fifth MOS transistor being connected to an output terminal of the second error amplifier. A feedback resistance element is connected between a drain terminal of the fifth MOS transistor and a second input terminal of the second error amplifier. A gate terminal of the third MOS transistor is connected to a drain terminal of the fifth MOS transistor, and a gate terminal of the fourth MOS transistor is connected to a node between the first and the second voltage distribution resistance.

Even more specifically a capacitor is connected between the output terminal of the second error amplifier and the drain terminal of the fifth MOS transistor.

Even more specifically a current source generating unit is connected to a drain terminal of the second MOS transistor, the current source generating unit being capable of generating a current source having a predetermined current ratio in response to an external control current generated from a transconductor controlling signal input unit.

Even more specifically, the current source generating unit comprises a cascade current mirror circuit connected for generating a current ratio of n:1.

Even more specifically, the transconductor controlling signal input unit comprises a sixth MOS transistor, a drain terminal of the sixth MOS transistor being connected to an external resistance, a source terminal of the sixth MOS transistor being connected to the power supply. A third error amplifier is provided for receiving a voltage drop signal of the external resistance through a non-inverted terminal of the third error amplifier, an external input signal being received through an inverted terminal of the third error amplifier, an output terminal of the third error amplifier being connected to a gate terminal of the sixth MOS transistor. A seventh MOS transistor is provided, a source terminal of the seventh MOS transistor being connected to the power supply, a drain terminal of the seventh MOS transistor being connected to the current source generating unit and a gate terminal of the seventh MOS transistor being connected to the output terminal of the third error amplifier.

Even more specifically, a capacitor for compensating for frequency is connected between the non-inverted terminal of the third error amplifier and the gate terminal of the sixth MOS transistor.

BRIEF DESCRIPTION OF THE DRAWINGS

The disclosed teachings are described in detail with reference to the following drawings in which like reference numerals refer to like elements wherein.

DETAILED DESCRIPTION

The following detailed description will present an example of a transconductor tuning circuit embodying the disclosed teachings with reference to the accompanying drawings.

Figure 2:
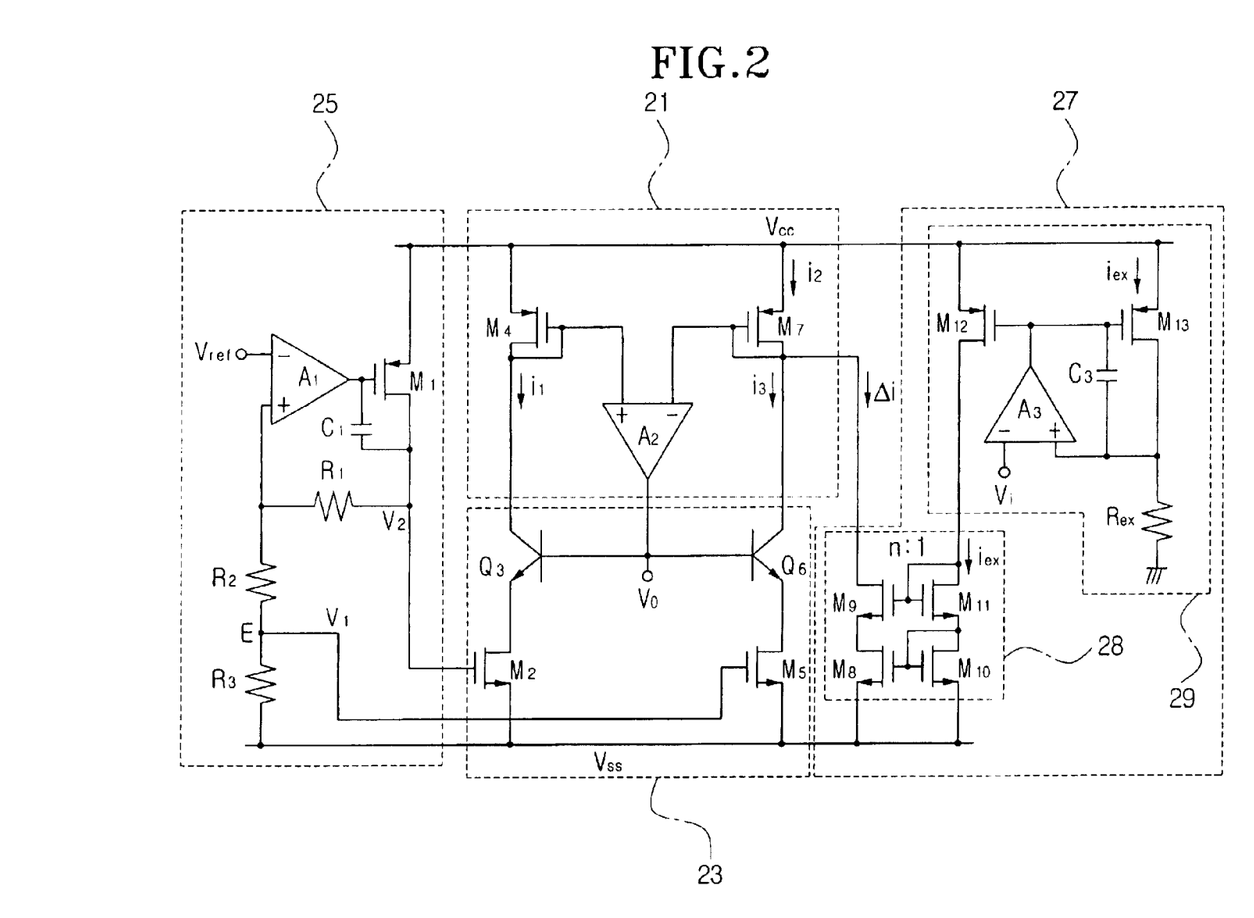
FIG. 2 is a circuit diagram representing an example of a tuning circuit of a transconductor that embodies the disclosed teachings.

FIG. 2 is a circuit diagram representing an example of a tuning circuit of a transconductor that embodies the disclosed teachings. Referring to FIG. 2, the example transconductor tuning circuit includes a first error amplifier A2, a first MOS(Metal-Oxide Semiconductor) transistor M4 and a second MOS transistor M7.

The first MOS transistor M4 of a tuning unit 21, is connected to a power supply voltage Vcc through its source terminal. The gate and drain terminals of the first MOS transistor are mutually connected in common so that they may operate as a MOS diode.

The second MOS transistor M7 is also connected in a manner symmetric to the first MOS transistor. Namely, the second MOS transistor M4 is connected to the power supply voltage Vcc through its source terminal. The gate and drain terminals of the second MOS transistor are mutually connected in common so that they also may operate as a MOS diode.

The error amplifier A2 is configured such that its non-converted and converted terminals are connected to the gate terminals of the first and the second MOS transistors M4 and M7, respectively.

An example transconductor 23 receives an output voltage Vo of the tuning unit. This output voltage signal acts as a bias signal. The transconductor 23 includes a first and a second bipolar transistors Q3 and Q6, and a third and a fourth MOS transistors M2 and M5.

The base terminals of the first and the second bipolar transistors Q3 and Q6 are connected to receive the output signal from the first error amplifier A2. This output signal acts as a bias signal used for tuning control. Also, collector terminals of the first and the second bipolar transistors Q3 and Q6 are connected to corresponding drain terminals of the first and the second MOS transistors M4 and M7, respectively.

Drain terminals of the third and the fourth MOS transistors M2 and M5 are connected to emitter terminals of the first and the second bipolar transistors Q3 and Q6. Gate terminals of the third and the fourth MOS transistors M2 and M5 receive differential signals generated from a differential input signal generating unit 25, respectively.

It should be understood that for the differential input signal generating unit 25, a variety of circuits for generating a differential signal could be used alternately.

The differential input signal generating unit 25 used in the example illustrated in FIG. 2, has a second error amplifier A1 whose inverted terminal receives a reference voltage Vref, and whose non-inverted terminal is connected to a first and a second voltage distribution resistances R2 and R3 connected in series.

A fifth MOS transistor M1 is connected to the power supply Vcc through its source terminal and connected to an output terminal of the second error amplifier A1 through its gate terminal.

A feedback resistance element is connected between a drain terminal of the fifth MOS transistor M1 and a non-inverted input terminal of the second error amplifier A1.

Capacitor C1 is provided for frequency compensation.

A voltage V2 maintained in the drain terminal of the fifth MOS transistor M1 is provided to the gate terminal of the third MOS transistor M2. Likewise, a voltage V1 maintained in a node E between the first and the second voltage distribution resistances, is provided to the gate terminal of the fourth MOS transistor M5.

An output current varying unit 27 is provided for controlling a current flowing through an output terminal of the transconductor 23. It includes a current source 28 and a transconductor controlling signal input unit 29.

A cascade current mirror unit is used as a current source 28. It is connected to the drain terminal of the second MOS transistor M7 to get a current having a current ratio of n:1 to flow in response to an external control current $i_{ex}$ generated by the transconductor controlling signal input unit 29.

The transconductor controlling signal input unit 29 includes a sixth and a seventh MOS transistors M13 and M12, an external resistance $R_{ex}$ and a third amplifier A3.

The sixth MOS transistor M13 is connected to the external resistance $R_{ex}$ through its drain terminal and connected to the power supply Vcc through its source terminal.

The third error amplifier A3 is configured such that its non-converted terminal receives a voltage drip signal of the external resistance $R_{ex}$, its converted terminal receives an external input signal V1, and its output terminal is connected to gate terminals of the sixth and the seventh MOS transistors M13 and M12.

The seventh MOS transistor M12 is connected to the power supply Vcc through its source terminal and connected to one end of the current source 28 through its drain terminal.

In FIG. 2, a capacitor denoted by a reference numeral C3 is used for frequency compensation.

Operation of the tuning circuit is described herein.

The voltages V1 and V2 generated from the differential input signal generating unit 25, are provided as input signals to the transconductor 23. Also, the control current $i_{ex}$ generated by the external reference resistance $R_{ex}$ and a control voltage Vi, cause a current Δi to flow via the second MOS transistor M7. This is due to the current source having a current ratio of n:1. Currents i1 and i3 flow through the first and the second MOS transistors M4 and M7, respectively. These currents i1 and i3 are controlled to have the same value by the first error amplifier A2. The amplifier A2 generates an output voltage Vo proportional to Δi/Δv. Here, Δv represents a difference between V1 and V2.

Gate and drain terminals of the M4 and M7 are connected in common so that M4 and M7 may be self-biased. Therefore, the first error amplifier A2 detects voltage difference between M4 and M7 gate terminals and controls base voltages of the bipolar transistors Q3 and Q6 to be identical collector current, i1 and i2.

In case the magnitudes of the currents i1 and i2 are small, a low voltage subtracting threshold voltages of the first and the second MOS transistors M4 and M7 from the power supply Vcc, is provided to the first error amplifier A2. Therefore a NMOS input differential amplifier with an input restriction range close to the power supply Vcc is used as the error amplifier A2.

Figure 3:
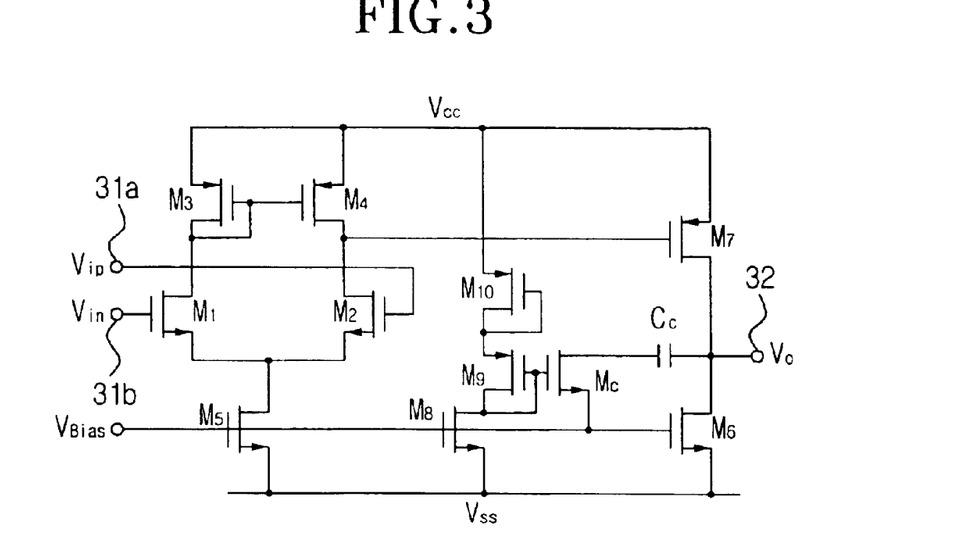
FIG. 3 is a circuit diagram representing an example for a NMOS differential amplifier applied to an error amplifier of FIG. 2.

An example of the NMOS input differential amplifier is illustrated in FIG. 3. In FIG. 3, reference numerals 31a and 31b represent input terminals, respectively. Reference numeral 32 represents an output terminal.

The transistor pair performing an amplifying function in the tuning circuit of FIG. 2 is made of a MOS diode structure. Consequently, its amplifying degree is lower than an amplifying degree made of Q6 and M5, or Q9 and M8 in FIG. 1, Such transistor pair includes, a pair of the first bipolar transistor Q3 and the first MOS transistor M4, or a pair of the second bipolar transistor Q6 and second MOS transistor M7. Therefore, frequency characteristics of a closed circuit formed by the first error amplifier A2, the first bipolar transistor Q3 and the first MOS transistor M4, are completely determined by the first error amplifier A2. Likewise the frequency characteristics of a closed circuit formed by the second bipolar transistor Q6 and the second MOS transistor M7, are completely determined by the first error amplifier A2. Accordingly, if A2 is an error amplifier that operates in high frequency and has a predetermined phase margin, then the whole tuning circuit will be capable of having an operation range with a wide frequency band.

Since the tuning circuit controls transconductance value using the control current Δi, a wide range of variation is possible using the current source having a ratio of n:1.

Effect of the disclosed transconductor tuning circuit on external environments is considered herein.

The voltage V1 and V2 provided to the gates of the third and the fourth MOS transistors M2 and M5, are given by the following formulae.

$$V_1 = V_{ref} \frac{R_3}{R_2 + R_3} \quad \text{[Formula 2]}$$

$$V_2 = V_{ref}\left(1 + \frac{R_1}{R_2 + R_3}\right) \quad \text{[Formula 3]}$$

Here, if R1=R2=R, then V2−Vref=Vref−V1. Therefore, voltages having the same variable quantities with the reference voltage are applied for gate voltages of the third and the fourth MOS transistors M2 and M5. In that case, a voltage difference ΔV applied to the gates of the third and the fourth MOS transistors M2 and M5 is given by the following formula.

$$\Delta V = \quad \text{[Formula 4]}$$
$$V_2 - V_1 = V_{ref}\left(1 + \frac{R_1}{R_2 + R_3}\right) - V_{ref}\frac{R_3}{R_2 + R_3} = V_{ref}\frac{2R}{R + R_3}$$

Figure 4:
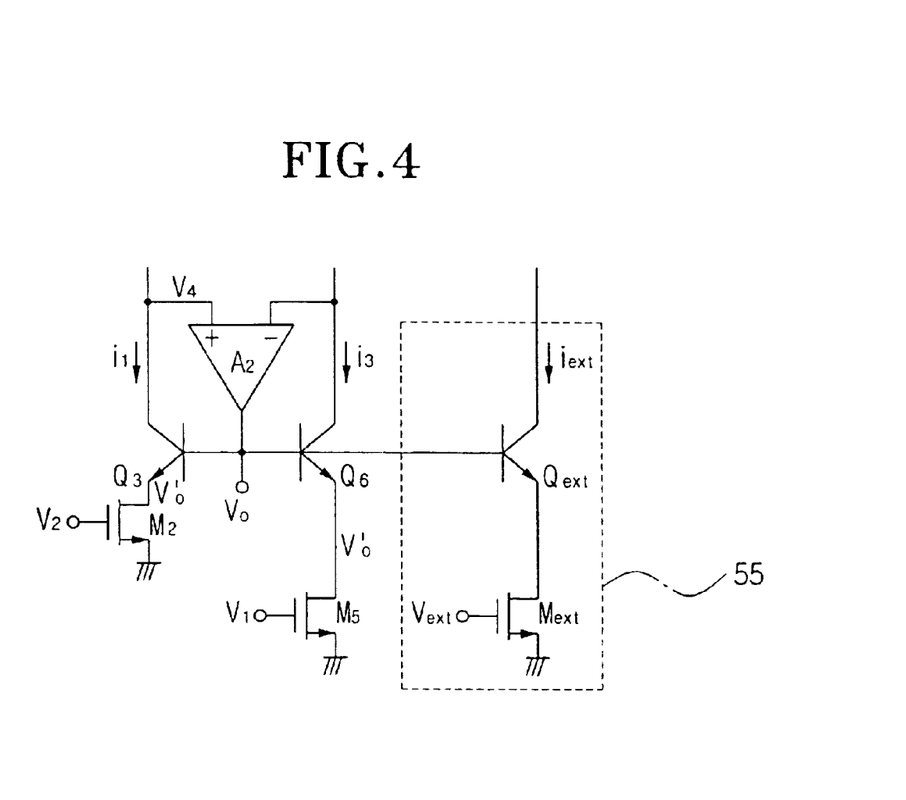
FIG. 4 is a circuit diagram representing an example of applying an output of a tuning circuit of FIG. 2 to an external transconductor.

An example of using an output voltage Vo of the transconductor tuning circuit for an external transconductor circuit, is illustrated in FIG. 4. Elements having the same function are referred to by the same reference numerals as in FIG. 2. In FIG. 4, a portion denoted by a reference numeral 55 is an external transconductor circuit that is required to be tuned by the tuning circuit.

Vo' is defined as a difference Vo−$V_{BE}$ between an output voltage of the first error amplifier A2 and a base-emitter voltage $V_{BE}$ of a bipolar transistor. The bias currents i1,i3 and $i_{ext}$ are given by the following formula.

$$i_1 = k\left[(V_2 - V_T)V_o' - \frac{1}{2}V_o'^2\right] \quad \text{[Formula 5]}$$

$$i_3 = k\left[(V_1 - V_T)V_o' - \frac{1}{2}V_o'^2\right] \quad \text{[Formula 6]}$$

$$i_{ext} = k_{ext}\left[(V_{ext} - V_T)V_o' - \frac{1}{2}V_o'^2\right] \quad \text{[Formula 7]}$$

In formulae 5 through 7, k and $V_T$ represent a current formula constant and a threshold voltage, respectively. Also, the MOS transistors M2, M5 and Mext operate in an ohmic range, and the same sizes of the third and the fourth MOS transistors M2 and M5, namely, the same channel modulation factors are used.

From the above formulae, a current difference Δi for a gate input voltage difference ΔV of the third and the fourth MOS transistors M2 and M5, is given by the following formulae.

$$\Delta i = i_1 - i_3 = k(V_2 - V_1)V_o' = k\Delta V V_o' \quad \text{[Formula 8]}$$

Accordingly, from formula 8, Vo' is defined by the following formula.

$$V'_o = \frac{\Delta i}{k\Delta V} \quad \text{[Formula 9]}$$

From this formula, transconductance $g_{mext}$ for an external MOS transistor Mext is given by the following formula.

$$g_{mext} = k_{ext} V'_o \quad \text{[Formula 10]}$$

Inserting Vo' of the formula 9 into the above formula 10, the following formula is obtained.

$$g_{mext} = \frac{k_{ext}}{k} \frac{\Delta i}{\Delta V} = \frac{W_{ext}/L_{ext}}{W/L} \frac{\Delta i}{\Delta V} \quad \text{[Formula 11]}$$

In formula 11, $W_{ext}/L_{ext}$, W/L represent size ratios of an external MOS transistor Mext, and the third and the fourth MOS transistors M2 and M5, respectively.

From formula 11, it is clear that transconductance of the external MOS transistor Mext is determined by a size ratio of the MOS transistor, the control current $\Delta i$ and the control voltage $\Delta V$. Therefore, factors such as the power supply, process, temperature, etc, have no influence on the transconductance of the external transconductor 55.

Figure 5:
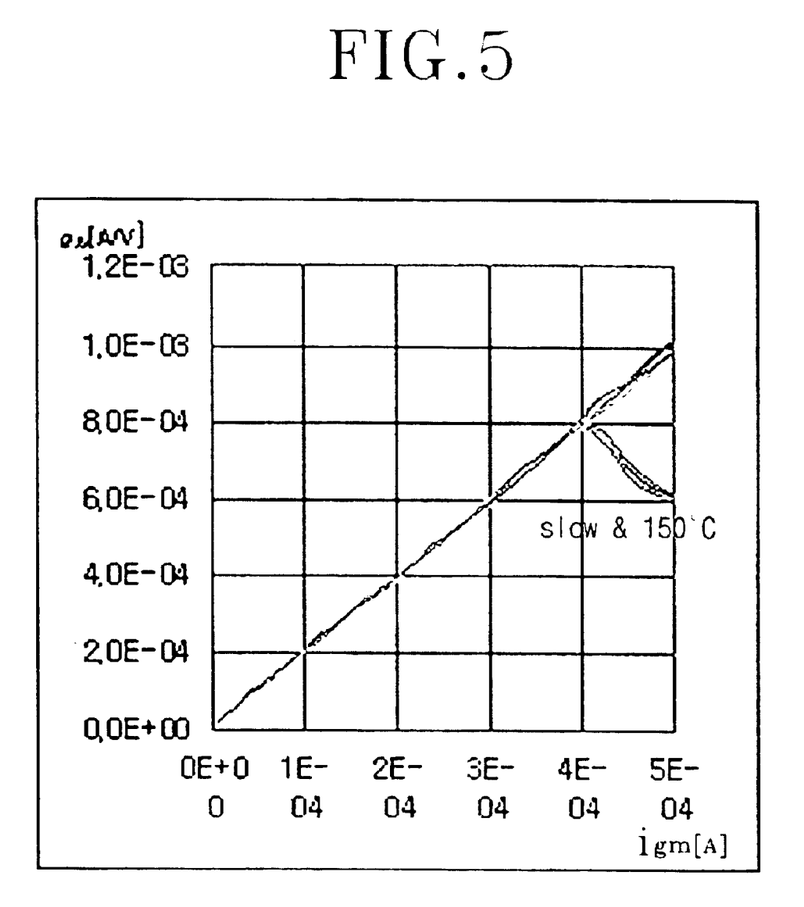
FIG. 5 is a graph showing transconductance measured for a change in a power supply voltage, a frequency, temperature regarding a circuit of FIG. 2.

A graph measuring changes in the transconductance value $g_m$(y-axes) with tuning current $i_{gm}$(x-axes) varied in normal and 16 Worst condition (power supply[±10%: 4.5, 5.5V], temperature[0° C., 150° C.] and Fabrication process[n-type device, p-type device: Fast-Fast, Fast-Slow, Slow-Fast, Slow-Slow]), is illustrated in FIG. 5. As shown in FIG. 5, uniform characteristics are obtained for up to 400 μA/V where the third and the fourth MOS transistors M2 and M5 operate in an ohmic range.

Figure 6:
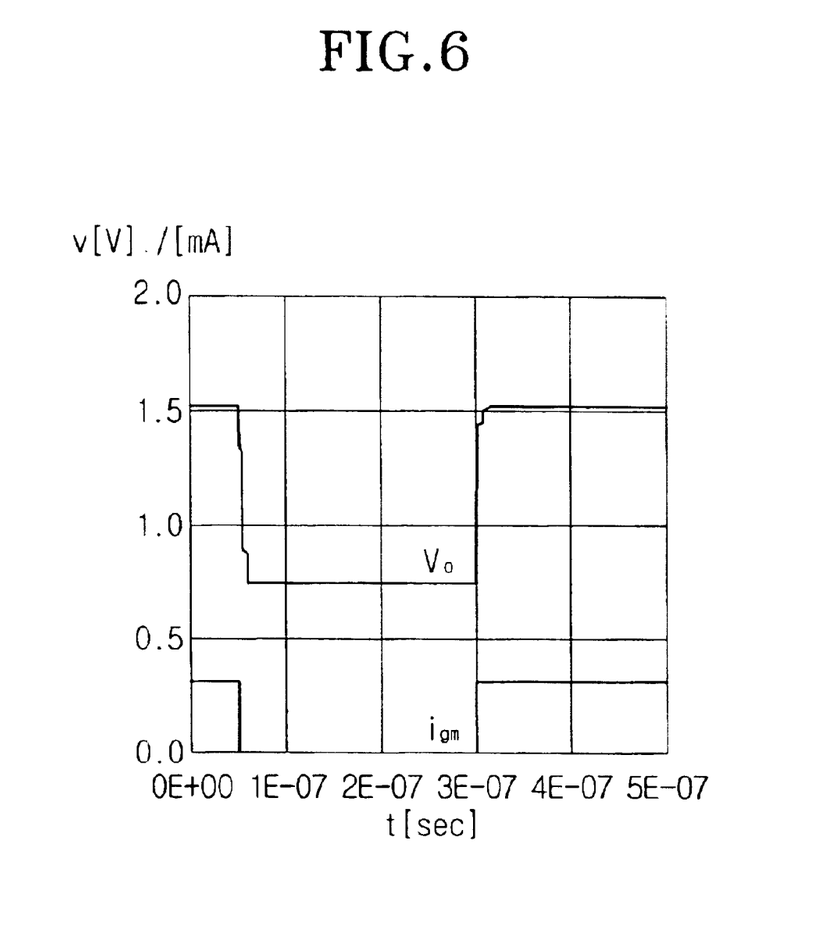
FIG. 6 is a graph showing measurements for an output voltage Vo of a tuning circuit when an output current Δi is changed in high speed regarding a circuit of FIG. 2.

In the meantime, FIG. 6 is a graph showing measurement results for an output voltage Vo of a tuning circuit when transconductance tuning current $i_{gm}$ is changed in high speed in a circuit of FIG. 2. As shown in FIG. 6, a stable output $V_o$ is provided for a wide range of frequency.

Figure 7:
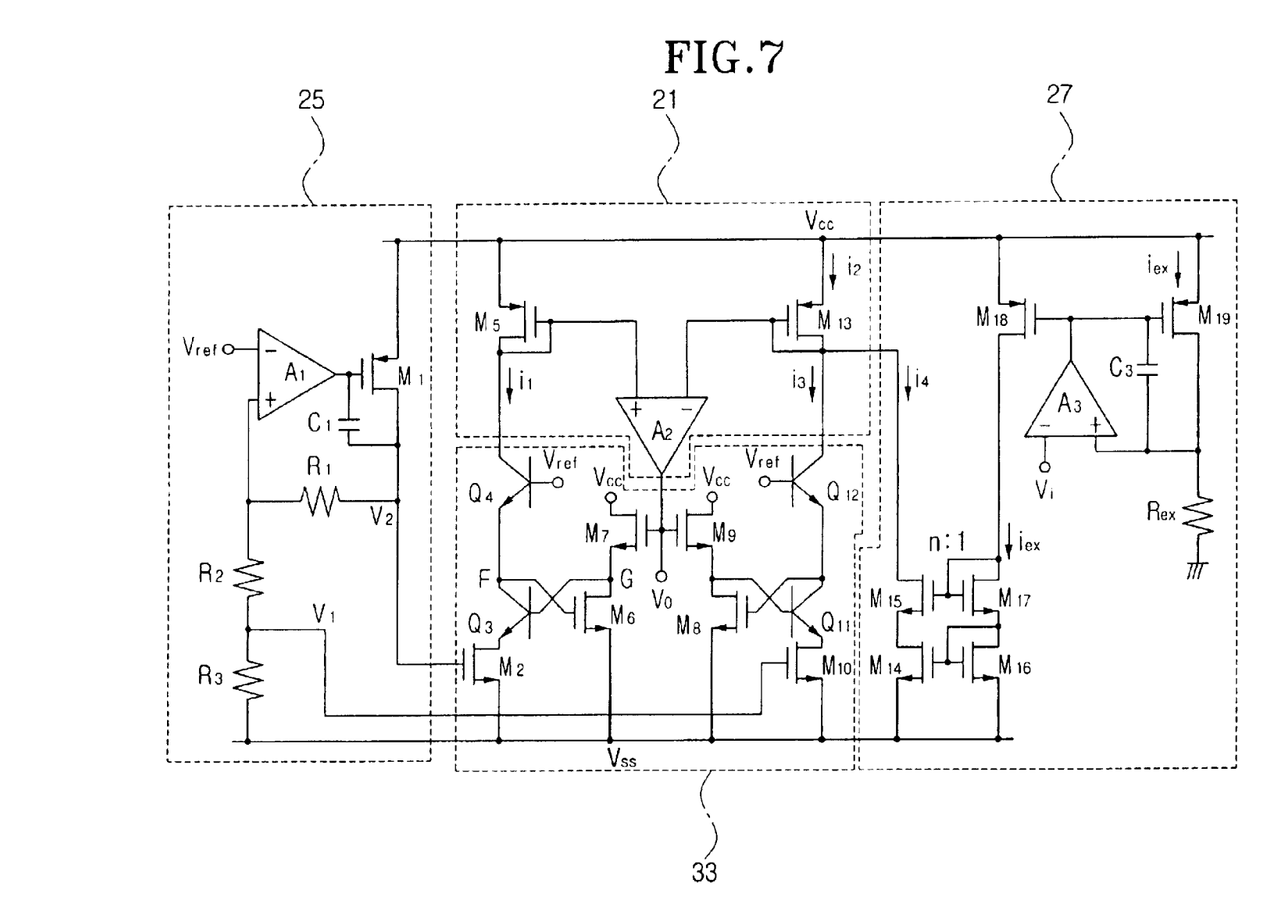
FIG. 7 is a circuit diagram representing another example of a tuning circuit of a transconductor according to an aspect of the disclosed teachings.

FIG. 7 is a circuit diagram representing a tuning circuit for controlling a transconductor of a crossing pair instead of the transconductor 23 of FIG. 2.

Referring to FIG. 7, a transconductor 33 is configured such that basic crossing pair transconductor units having a crossing pair structure, are connected symmetrically to a first and a second MOS transistors M5 and M13.

A first basic crossing pair transconductor unit, has a first bipolar transistor Q4 whose collector terminal is connected to a drain terminal of the first MOS transistor M5. It further has a second bipolar transistor Q3 whose collector terminal is connected to an emitter terminal of the first bipolar transistor Q4.

Also, the first basic crossing pair transconductor unit, has a third MOS transistor M7 whose drain terminal is connected to a power supply Vcc, and a fourth MOS transistor M6 whose drain terminal is connected to a source terminal of the third MOS transistor M7.

A node F is connected to a gate terminal of the fourth MOS transistor M6. The first bipolar transistor Q4 and the second bipolar transistor Q3 are mutually connected to the node F. A node G is connected to a base terminal of the second bipolar transistor Q3. The third MOS transistor M7 and the fourth MOS transistor M6 are mutually connected to G.

A reference voltage Vref is provided to a base terminal of the first bipolar transistor Q4. An output signal Vo from a first error amplifier A2 is provided to a gate terminal of the third MOS transistor M7.

A second basic crossing pair transconductor unit is symmetric with respect to the first basic crossing pair transconductor in its structure, and connected so that it receives a signal V1 output from a differential input signal generating unit 25.

In the transconductor 33 having such crossing pair structure, a signal corresponding to a difference between the reference voltage Vref provided to a base terminal of the first bipolar transistor Q4 and the output signal Vo from the first error amplifier A2, determines a drain-source voltage of the fifth MOS transistor M2. Also, in the transconductor 33 having such crossing pair structure, the drain-source voltage of the fifth MOS transistor M2 is maintained constant regardless of a size of an input voltage Vi.

The tuning circuit of improved frequency characteristics and control range is possibly used for a high frequency, a wide range variable amplifier and a filter.

It should be clear that a transconductor circuit other than the example described above, could also be used without deviating from the spirit and acope of the disclosed teachings As is apparent from the foregoing, according to the tuning circuit of the present invention, a control range for the transconductor is widened and a high speed control is possible.

While the invention has been shown and described with reference to certain preferred embodiments thereof, it will be understood by those skilled in the art that various changes in form and details may be made therein without departing from the spirit and scope of the invention as defined by the appended claims.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A transconductor tuning circuit for controlling transconductance of a transconductor, the tuning circuit comprising:

a first MOS (Metal-Oxide Semiconductor) transistor, a source terminal of said first MOS transistor being connected to a power source, a gate terminal and a drain terminal of the first MOS transistor being connected to each other;

a second MOS transistor, a source terminal of said second MOS transistor being connected to the power source, a gate terminal and a drain terminal of the second MOS transistor being connected; and a first error amplifier, a first input terminal of the first error amplifier being connected to the gate terminal of the first MOS transistors, a second input terminal of the first error amplifier being connected to the gate terminal of the second MOS transistor, wherein the first error amplifier outputs an output signal in form of a bias signal for controlling tuning of the transconductor.

2. The tuning circuit according to claim 1, wherein the transconductor comprises:

a first and a second bipolar transistors connected for receiving, through base terminals, a bias signal for tuning control in common, and whose collector terminals are connected to drain terminals of the first and the second MOS transistors, respectively; and a third and a fourth MOS transistors connected for respectively receiving, through gate terminals, differential input signals generated from a differential input signal generating unit and whose drain terminals are connected to emitter terminals of the first and the second bipolar transistors, respectively.

3. The tuning circuit according to claim 2, wherein the differential input signal generating unit comprises:

a second error amplifier, to a first input terminal of which a reference voltage is provided, to a second input terminal of which a plurality of a first and a second voltage distribution resistance are connected in series;

a fifth MOS transistor whose source terminal is connected to the power supply, whose gate terminal is connected to an output terminal of the second error amp;

a feedback resistance element connected between a drain terminal of the fifth MOS transistor and an input terminal of the second error amplifier, and:

a gate terminal of the third MOS transistor is connected to a drain terminal of the fifth MOS transistor, and a gate terminal of the fourth MOS transistor is connected a node between the first and the second voltage distribution resistance.

4. The tuning circuit according to claim 3, further comprising a capacitor for compensating for frequency, connected between the output terminal of the second error amplifier and the drain terminal of the fifth MOS transistor.

5. The tuning circuit according to claim 4, further comprising a current source generating unit connected to a drain terminal of the second MOS transistor, for generating a current source having a predetermined current ratio in response to an external control current generated from a transconductor controlling signal input unit.

6. The tuning circuit according to claim 5, the current source generating unit is a cascade current mirror circuit connected for generating a current ratio of n:1.

7. The tuning circuit according to claim 5, wherein the transconductor controlling signal input unit comprises:

a sixth MOS transistor whose drain and source terminals are connected to an external resistance and the power supply, respectively;

a third error amplifier for receiving a voltage drop signal of the external resistance through its non-inverted terminal, receiving an external input signal through its inverted terminal and whose output terminal is connected to a gate terminal of the sixth MOS transistor, a seventh MOS transistor whose source and drain terminals are connected to the power supply and one end of the current source generating unit and whose gate terminal is connected to the output terminal of the third error amplifier a seventh MOS transistor, a source terminal of the seventh MOS transistor being connected to the power supply, a drain terminal of the seventh MOS transistor being connected to the current source generating unit and a gate terminal of the seventh MOS transistor being connected to the output terminal of the third error amplifier.

8. The tuning circuit according to claim 7, further comprising a capacitor for compensating for frequency, connected between the non-inverted terminal of the third error amplifier and the gate terminal of the sixth MOS transistor.

* * * * *